United States Patent [19]  
Thompson et al.

[11] 4,328,610  
[45] May 11, 1982

[54] METHOD OF REDUCING ALPHA-PARTICLE INDUCED ERRORS IN AN INTEGRATED CIRCUIT

[75] Inventors: Charles E. Thompson, Carlsbad; Roger G. Newell, La Jolla, both of Calif.

[73] Assignee: Burroughs Corporation, Detroit, Mich.

[21] Appl. No.: 143,867

[22] Filed: Apr. 25, 1980

[51] Int. Cl.³ .................... H01L 7/54; H01L 21/263
[52] U.S. Cl. ...................................... 29/571; 148/1.5; 29/576 B
[58] Field of Search ................ 29/576 B, 271; 148/1.5

[56] References Cited

U.S. PATENT DOCUMENTS 3,570,112  3/1971  Barry et al. ..................... 29/576 B
4,201,598  5/1980  Tanaka et al. ..................... 148/1.5
4,230,791 10/1980  Chu et al. .............................. 148/1.5
4,235,010 11/1980  Kawagoe ............................... 29/571
4,240,844 12/1980  Felice et al. ........................ 148/1.5

Primary Examiner—Donald L. Walton  
Attorney, Agent, or Firm—Charles J. Fassbender; Kevin R. Peterson

[57] ABSTRACT

Alpha-particle induced errors in integrated circuits, especially those used for memory storage, are reduced by subjecting the partially completed, or fully completed, integrated circuits to neutron irradiation. This irradiation creates "traps" in the single crystalline semiconductor substrates of the integrated circuits for any unwanted charged particles that are produced by alpha particle radiation. Consequently, such unwanted charged particles do not disrupt the integrity of any data stored in the circuit. In one embodiment, the neutron irradiation is applied during wafer fabrication and, in a second embodiment, the irradiation is applied after wafer fabrication but before packaging of the circuit, and in the third embodiment the irradiation is applied after a completion of the packaging step of the integrated circuits.

10 Claims, 7 Drawing Figures

FIG. 3
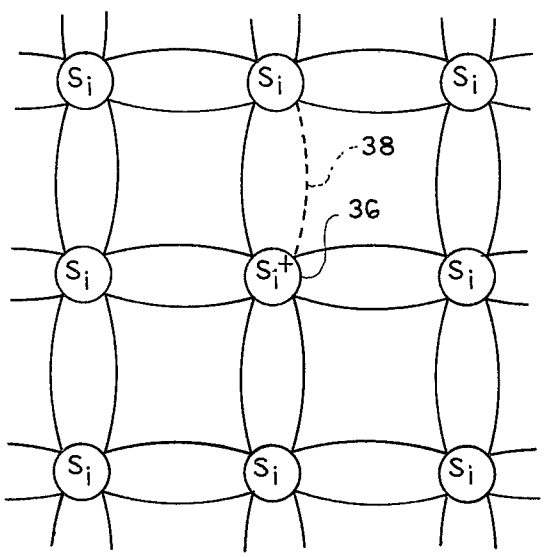
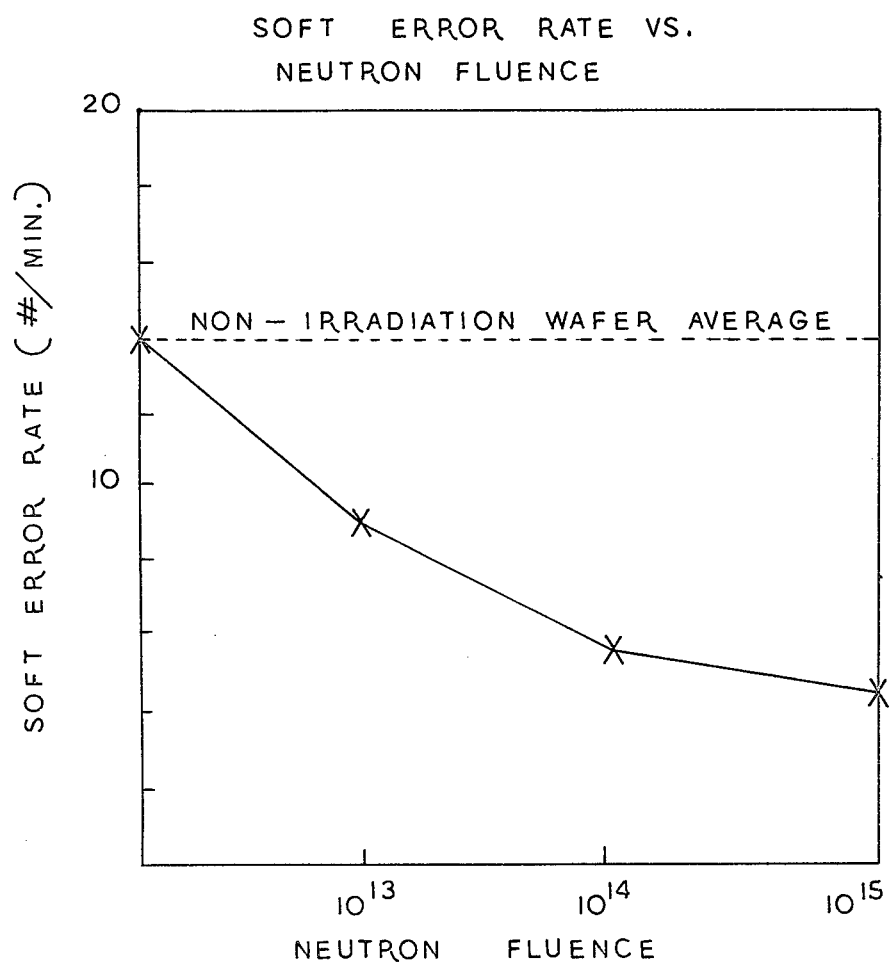
FIG. 7

METHOD OF REDUCING ALPHA-PARTICLE INDUCED ERRORS IN AN INTEGRATED CIRCUIT

BACKGROUND OF THE INVENTION

The present invention relates to a method for fabricating integrated circuits and in particular to a method for fabrication of data storage type integrated circuits for protection against errors induced by the bombardment of an ionizing radiation.

In the trend towards smaller components in integrated circuits to achieve higher density, an error causing mechanism, not previously considered a factor in larger component circuits, in the form of the passage of alpha particles into the integrated circuit, has become a major problem particularly in those circuits intended for memory storage. The passage of the alpha particles into the integrated circuit generates sufficient hole-electron pairs, by the dissipation of energy, to disrupt the integrity of stored data, as an example, in small memory storage cells requiring only a small number of electrons to be retained for the storage of a binary digit.

It has been shown that alpha particles are responsible for charge induced errors. These alpha particles originate from radioactive decay of radioactive impurities present in the materials used to fabricate the integrated circuit. A few parts per million or less of radioactive impurities present in the materials emit a sufficiency of alpha particles, as nuclear decay products, to cause an unacceptably high probability of the electrons generated by an alpha particle decay to change the charge stored in the integrated circuit.

Stated another way, soft errors in storage memories, such as MOS dynamic RAM's, are caused by their exposure to alpha particle radiation. Alpha particles are the natural product of the radioactive decay of uranium and thorium present in most materials used in the fabrication of RAM's and thus radiation produces an unwanted charged particle in the silicon semiconductor material which upsets the wanted charge during the normal device operation.

Accordingly, it is a prime object of this invention to provide a method of reducing alpha particle induced soft error sensitivity in integrated circuits.

SUMMARY OF THE INVENTION

The invention which meets the foregoing object comprises the method of subjecting partially completed, or fully completed, integrated circuits to neutron irradiation to reduce charge induced soft errors, by creating electron traps in the single crystalline semiconductor substrates so that hole-electron pairs, formed by the dissipation of energy from the passage of an alpha particle into the substrates, are trapped in the substrates and thus do not disrupt the integrity of stored data. In one embodiment, the neutron irradiation is applied during wafer fabrication, and in a second embodiment the irradiation is applied after wafer fabrication, but before the packaging step, and in the third embodiment the irradiation is applied after a completion of the packaging step of the integrated circuits.

BRIEF DESCRIPTION OF THE DRAWINGS

FIG. 3 is a simplified version of the lattice structure of the crystal silicon semiconductor substrate and the affect of neutron irradiation as part of the method of this invention;

FIG. 7 is a graph of Soft Error Rate vs Neutron Fluence as related to one size RAM.

DETAILED DESCRIPTION

Figure 1:
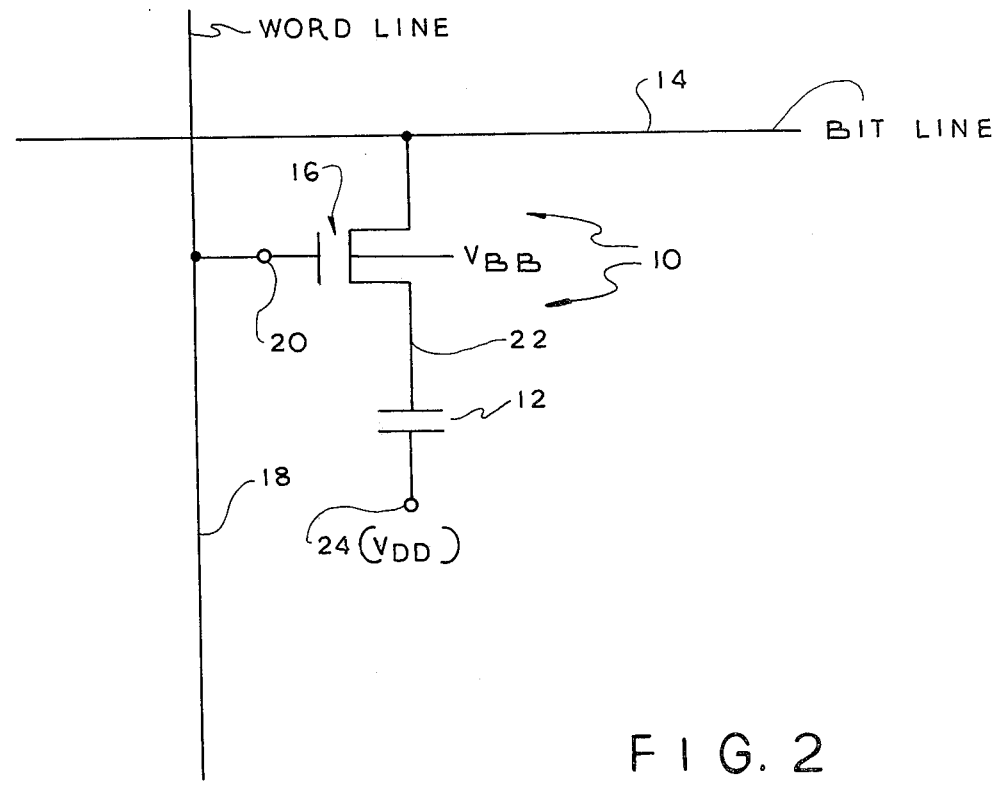
FIG. 1 is a schematic diagram of a MOS RAM memory.

FIG. 1 shows a single storage cell 10 of a MOS RAM memory with a capacitor 12 which stores a charge which may be affected by alpha particle radiation and is thus illustrated for the purpose of understanding this invention. It is to be understood that in a MOS RAM memory other capacitances are important to its operation such as capacitance inherent in bit line 14 and this invention also reduces the alpha particle radiation effects on charges in those capacitances.

In the illustrated circuit, the capacitor 12 is charged and discharged by a MOS field effect transistor 16 acting as switch or transfer gate coupled between the bit line 14 and a word line 18. Several of these cells, each storing charge representing one binary bit, are connected to several such bit and word lines to form a memory. For example, 16,348 cells are in a 16 K RAM and 65,536 cells are in a 64 K RAM.

In the circuitry shown, transistor 16 enables current to flow between storage cell 12 and bit line 14 depending upon a voltage applied from a suitable source to a gate electrode 20 via the word line 18. One side of the capacitor 12 is illustrated schematically as connected to the transistor source 22, while the other side is shown connected at 24 to voltage source VDD of some selected positive level. Voltage source $V_{BB}$ is a negative substrate bias.

To read a bit of data from a cell, the bit line is first precharged to some positive value. Then if a binary 0 is stored in the cell, the bit line voltage will be reduced to a lesser voltage when a select pulse is applied to word line 18. If a binary 1 is stored in the cell when word line 18 is pulsed, bit line 14 will remain near the precharge voltage level.

Figure 2:
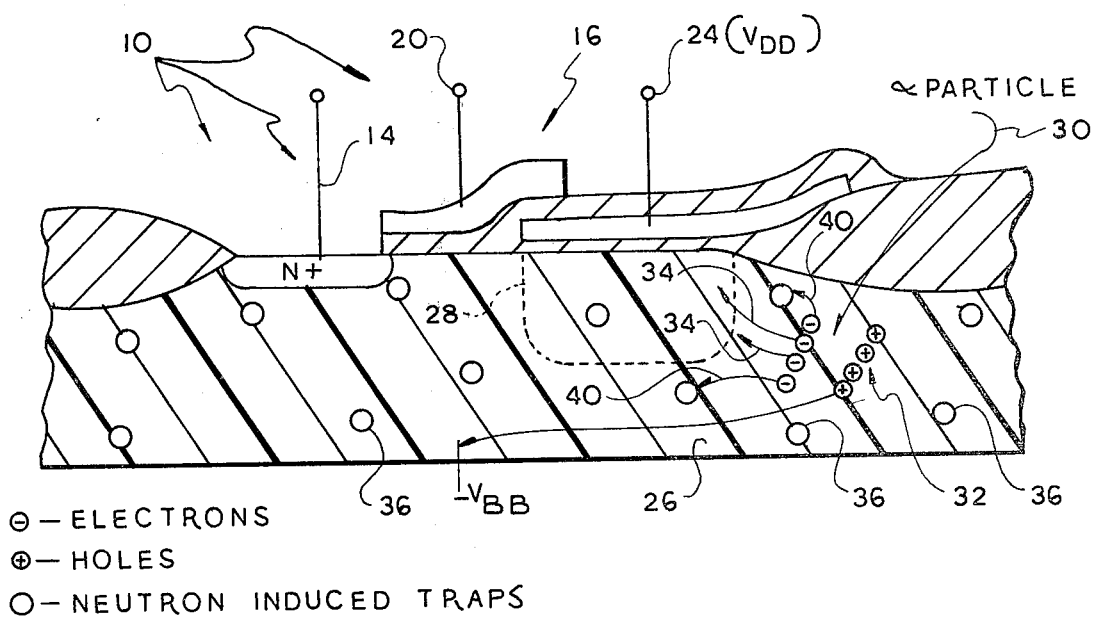
FIG. 2 is a cross-sectional simplified version of the structure involved in the cell of FIG. 1 and also showing an alpha particle having entered the substrate.

Turning now to FIG. 2, there is shown a cross-section of cell 10 comprising MOS transistor 16 forming the transfer gate, source, and drain corresponding to that shown in FIG. 1. Semiconductor substrate 26 is of the P-type, and a potential well 28 formed in the substrate. It is this potential well which forms part of capacitor 12 in FIG. 1. The potential well may be voltage induced in the substrate or formed by dopants.

Also shown in FIG. 2, is the introduction of an alpha particle into the substrate from any one of the sources mentioned hereinabove and represented by arrow 30. As the alpha particle dissipates its energy into the substrate, hole-electron pairs are formed in the substrate. This is illustrated in simplistic form by the parallel rows of electrons and holes indicated in the area 32.

Since the charge of the capacitor is the stored information, (i.e., a binary 0 equals stored electrons in the potential well and a binary 1 is the absence of stored electrons in the potential well) any electrons formed by the alpha particle radiation entering the potential well is unwanted and can cause errors. Such electrons are represented by arrows 34. The electrons need not fill the potential well with unwanted charges sufficient to form a false binary 0 but only enough that the sense amplifier cannot differentiate between a "1" or a "0". The smaller the cell, the smaller the potential well. Thus, unwanted electrons have a more serious affect on the function of a cell as its size is decreased.

In FIG. 3, a lattice structure of the crystal semiconductor substrate (silicon) is shown. This, of course, is a simplified illustration but it does show the electron balance of the silicon in a lattice crystal. By treating the cell with neutron irradiation, neutrons displace certain silicon atoms from certain locations in the lattice thus producing a crystalline structure with electron defficiencies or traps. This is illustrated by the trap 36 and by the dashed lattice bond 38 and the representation $Si^+$.

These displaced atoms, being dispersed throughout the crystal substrate, form a means for trapping the electrons generated by the alpha particle radiation in the substrate and thus reduce the possibility of electrons entering the potential well. A simplified version of this phenomenon is illustrated in FIG. 2 where the electrons formed by the alpha particle are shown entering traps in the crystal and represented by arrows 40. These traped electrons are subsequently removed each time a nearby memory cell is refreshed.

Figure 6:
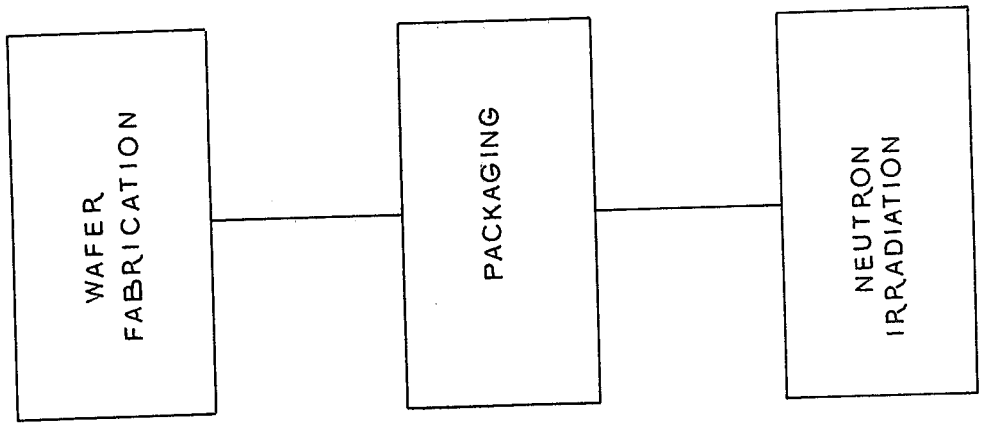
FIGS. 4, 5, and 6 are simplified flow diagrams of methods of making a MOS RAM memory package in which the neutron irradiation, forming part of this invention, is involved.
Figure 5:
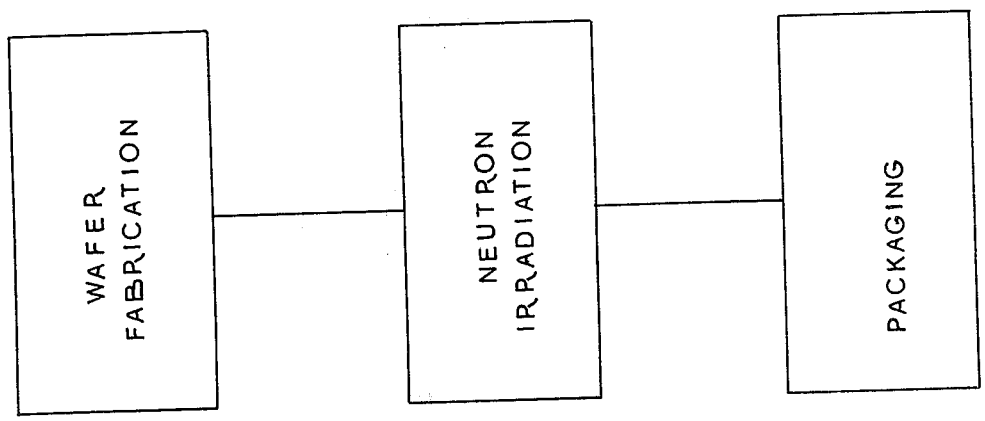
Figure 4:
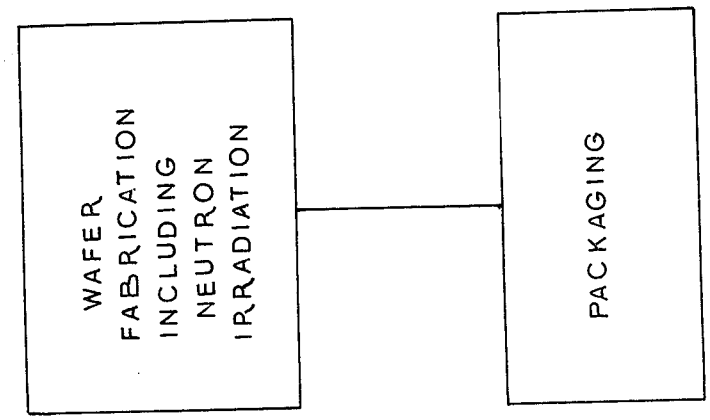

Turning now to FIGS. 4, 5, and 6, there are shown flow diagrams for fabricating memories with the neutron irradiation step being done at different steps in the process. In FIG. 4 under the designation "wafer fabrication" it is to be understood to include preparation of a single crystal substrate, growth or deposition of a dielectric layer such as silicon dioxide, photolithographic techniques used to etch selected openings in one or more passivating oxide layers which serve as ion diffusion or ion implantation openings through which controlled amounts of impurity atoms can be introduced to form circuit regions, etc.

At any convenient place in this wafer fabrication, the chip is subjected to neutron irradiation which forms the electron traps in the lattice structure of the crystal as shown very schematically in FIGS. 2 and 3. One convenient place for example, would be at the very start of the wafer fabrication—i.e., perform neutron irration on the bare silicon wafer. In any case, after the wafer fabrication and neutron irradiation is complete, each chip is suitably packaged in accordance with the conventional techniques.

The embodiment of FIG. 5 is identical to the series of steps of the embodiment of FIG. 4 except that the irradiation bombardment does not take place until just prior to the packaging step. And in the embodiment of FIG. 6, the irradiation step occurs after packaging is complete. Whether the process of FIG. 4 or the processes of FIGS. 5 or 6 are used is a design choice at the discretion of those skilled in the art of processing integrated circuits.

Finally, turning to FIG. 7, the advantage of the invention is shown in graph form. There, the error rate (the number of errors per minute) is plotted against neutron fluence, which is the number of neutrons that passed through a square centimeter of the wafer. This shows a 4 to 1 reduction in error rate as compared to non-irradiated wafer.

FIG. 7 was generated by running actual tests on 16K dynamic MOS RAMs, which were processed in accordance with the steps of FIG. 5. That is, the RAMs were subjected to Neutron Irradiation after the RAM wafer fabrication was complete, but before final packaging. This was a convenient place to perform the radiation because the RAMs were formed by a high temperature process, which would remove a portion of the traps if they were generated prior to performing the high temperature step. The actual irradiation step was performed at the University of Missouri using a "pool" type of reactor. All of the wafers were placed in the pool at a distance from the reactor's core where the neutrons which reached them were not thermal neutrons, but had energy levels of at least 1 million electron volts.

Various preferred embodiments and steps for carrying out the invention have now been described in detail. In addition, however, various changes and modifications can be made to these details without departing from the nature and spirit of the invention. Therefore, it is to be understood that the invention is not limited to said details but is defined by the appended claims.

What is claimed is:

1. In the manufacture of integrated circuit packages, the steps of:
   providing a semiconductor substrate,
   forming in said substrate capacitance means for receiving electron charges functional in the operation of said integrated circuit, and
   irradiating said substrate with neutrons to form electron traps in said substrate to prevent unwanted charges produced in said substrate by alpha-particle radiation from entering said capacitance means.

2. The method as claimed in claim 1 further including the step of forming conductive paths and contacts in a desired pattern to form an operational integrated circuit.

3. The method as claimed in claim 2 further including the step of packaging said integrated circuit for use in electronic devices.

4. The method as claimed in claim 1 further including, prior to performing said irradiation, the step of forming conductive paths and contacts in a desired pattern.

5. The method as claimed in claim 1 further including, prior to performing said irradiation, the step of packaging said integrated circuit for use in electronic devices.

6. In the manufacture of a semiconductor dynamic memory circuit, the steps of:
   providing a semiconductor substrate,
   forming in said substrate capacitances as a means for receiving electron charges representing information stored in said memory, and
   irradiating said substrate with neutrons to form electron traps in said substrate to prevent unwanted charges produced in said substrate by alpha-particle radiation from entering said capacitances when said memory circuit is operational.

7. The method as claimed in claim 6 further including forming conductive bit and word lines coupling said capacitances in a matrix for accessing individual capacitances as binary bit memory cells.

8. The method as claimed in claim 7 further including the step of packaging said memory circuit for use in electron devices.

9. The method as claimed in claim 6 further including, prior to performing said irradiation, the step of forming conductive word and bit lines coupling said capacitances in a matrix for accessing individual capacitances as binary bit memory cells.

10. The method as claimed in claim 6 further including, prior to performing said irradiation, the step of packaging said memory circuit for use in electronic devices.

* * * * *